US007718456B2

(12) United States Patent
Maeda et al.

(10) Patent No.: US 7,718,456 B2
(45) Date of Patent: May 18, 2010

(54) PACKAGE FOR HOUSING LIGHT-EMITTING ELEMENT AND METHOD FOR MANUFACTURING PACKAGE FOR HOUSING LIGHT-EMITTING ELEMENT

(75) Inventors: Masakatsu Maeda, Shunan (JP); Yasuyuki Yamamoto, Shunan (JP)

(73) Assignee: Tokuyama Corporation (JP)

( * ) Notice: Subject to any disclaimer, the term of this patent is extended or adjusted under 35 U.S.C. 154(b) by 537 days.

(21) Appl. No.: 11/664,181

(22) PCT Filed: Sep. 29, 2005

(86) PCT No.: PCT/JP2005/018040

§ 371 (c)(1),
(2), (4) Date: Mar. 29, 2007

(87) PCT Pub. No.: WO2006/035913

PCT Pub. Date: Apr. 6, 2006

(65) Prior Publication Data

US 2008/0023713 A1      Jan. 31, 2008

(30) Foreign Application Priority Data

Sep. 30, 2004    (JP) .............................. 2004-286971

(51) Int. Cl.
*H01L 21/00* (2006.01)
*H01L 33/00* (2010.01)

(52) U.S. Cl. .......................................... 438/40; 257/98

(58) Field of Classification Search ........... 257/79–103, 257/E51.018–E51.022; 438/22–47

See application file for complete search history.

(56) References Cited

U.S. PATENT DOCUMENTS 5,177,593 A * 1/1993 Abe ............................ 257/98

FOREIGN PATENT DOCUMENTS

| JP | 08-274378 A | 3/1995 |
| JP | 9-045965 A | 2/1997 |
| JP | 11-214582 A | 8/1999 |
| JP | 11-220178 A | 8/1999 |
| JP | 2002232017 A * | 8/2002 |
| JP | 2002-232017 A | 2/2003 |
| JP | 2003-037298 A | 2/2003 |
| JP | 2003-273405 A | 9/2003 |
| JP | 2004-152952 A | 5/2004 |
| JP | 2004-335495 A | 11/2004 |
| JP | 2005-166937 A | 6/2005 |

* cited by examiner

*Primary Examiner*—Calvin Lee
(74) *Attorney, Agent, or Firm*—The Webb Law Firm

(57) ABSTRACT

A package for housing a light-emitting element wherein a via hole for wiring provided so as to pass through an insulating substrate is arranged in such a manner that it is positioned under a reflector frame; a method for manufacturing the above package for housing a light-emitting element which comprises the steps of separately providing a green sheet for the substrate and a green sheet for the frame, causing a paste containing a ceramic powder to be present between the two green sheets to bind them, and subjecting them to degreasing and sintering, to thereby integrate them.

2 Claims, 6 Drawing Sheets

PACKAGE FOR HOUSING LIGHT-EMITTING ELEMENT AND METHOD FOR MANUFACTURING PACKAGE FOR HOUSING LIGHT-EMITTING ELEMENT

TECHNICAL FIELD

The present invention relates to a package for housing a light-emitting element that is used for housing a light-emitting element such as a light emitting diode (LED) and a method for manufacturing the package for housing a light-emitting element.

BACKGROUND ART

In recent years, a light-emitting element such as a light emitting diode is widely used as an illuminant for a lighting display board and a back light illuminant for a portable phone or a personal computer due to an improvement of a luminance thereof. Such a light-emitting element is used in the state that the light-emitting element is housed in a package for housing a light-emitting element.

Conventionally, for such a package for housing a light-emitting element, a cavity for housing a light-emitting element is formed on the upper face of an insulating substrate composed of one or a plurality of insulating layers laminated.

Moreover, a wiring pattern layer is formed in a bonded manner on an area from the bottom face to the outside of the cavity. The wiring pattern has a function for supplying to a light-emitting element a current that has been supplied from an external electric circuit, thereby generating a specified luminance. After the light-emitting element is mounted on the bottom face of the cavity through a bump electrode in such a manner that each electrode of the light-emitting element is electrically connected to the wiring pattern layer, the light-emitting element is air-tightly sealed in the cavity by filling with a glass or a transparent resin such as an epoxy resin, thereby fabricating a light-emitting apparatus as a final product.

For the package for housing a light-emitting element, there is bonded a light reflecting layer for reflecting a light emitted from the light-emitting element to an inside wall of the cavity of the insulating substrate so as to substantially increase a luminance of the light-emitting element. The light reflecting layer causes a light emitted from the light-emitting element to be bright and the characters and images that are displayed as a lighting display board to be bright and extremely vivid.

As the light reflecting layer, gold, silver, nickel, aluminum, rhodium, platinum or the like is suitably used. For instance, a metallization metal layer is bonded to the inside wall of the cavity of the insulating substrate in advance, and gold, silver, nickel, aluminum, rhodium, platinum or the like is bonded to the metallization metal layer by a plating method, a vacuum deposition, a sputtering method or the like, thereby forming the light reflecting layer in a bonded manner on the inside wall of the cavity of the insulating substrate. The light reflecting layer is not formed on the entire inside wall of the cavity, but is formed in a bonded manner at a distance from the bottom face of the cavity, thereby effectively preventing an electrically short circuit between the light reflecting layer and a wiring pattern layer on the bottom face of the cavity.

As a conducting method to a light-emitting element for such a package for housing a light-emitting element, there is proposed for instance a conducting method disclosed in Patent document 1 (Japanese Laid-Open Patent Publication No. 2002-232017). More specifically, as shown in FIG. 4, a package 100 for housing a light-emitting element related to Patent document 1 is provided with an insulating substrate 111 and a reflector frame 112 disposed on the peripheral section of the insulating substrate 111, and a cavity 119 for housing a light-emitting element is formed between the insulating substrate 111 and the reflector frame 112.

A through hole for wiring (so-called via hole) 116 provided so as to vertically pass through the insulating substrate 111 is formed in such a manner that it is positioned at the cavity 119 for housing a light-emitting element of the insulating substrate 111, that is, under the cavity 119 for housing a light-emitting element. A conductive material 117 is filled in the through hole for wiring 116, and wiring pattern layers 114 and 115 on the upper and bottom faces of the insulating substrate 111 conduct to each other through the conductive material 117. Consequently, a light-emitting element 118 mounted on the wiring pattern layer 114 on the upper face can electrically conduct to an external electric circuit.

Moreover, as a conducting method to a light-emitting element, for a package 200 for housing a light-emitting element disclosed in Patent document 2 (Japanese Laid-Open Patent Publication No. 1996-274378), as shown in FIG. 5, a through hole for wiring 216 is formed from the bottom of the cavity 219 for housing a light-emitting element of the insulating substrate 212 through an intermediate wiring portion 213 formed at the intermediate position of the insulating substrate 212 to the bottom face of the insulating substrate 212. A conductive material 217 is filled in the through hole for wiring 216, and wiring pattern layers 214 and 215 on the upper and bottom faces of the insulating substrate 212 conduct to each other through the conductive material 217. Consequently, a light-emitting element 218 mounted on the wiring pattern layer 214 on the upper face can electrically conduct to an external electric circuit.

Furthermore, for a package for housing a light-emitting element 300 disclosed in Patent document 3 (Japanese Laid-Open Patent Publication No. 2003-37298) and Patent document 4 (Japanese Laid-Open Patent Publication No. 2003-273405), as shown in FIG. 6, a through hole for wiring is not formed in the insulating substrate 311, and a wiring pattern layer 301 disposed between a reflector frame 312 and the insulating substrate 311 is arranged on the outside face of the insulating substrate 311 in such a manner that wiring pattern layers 314 and 315 formed on the upper and bottom faces of the insulating substrate 311 conduct to each other through the wiring pattern layer 301. Consequently, a light-emitting element 318 mounted on the wiring pattern layer 314 on the upper face can electrically conduct to an external electric circuit.

As described above, there are some methods to conduct to a light-emitting element, and a light-emitting element is mounted in a package for housing a light-emitting element in such a manner that the light-emitting element can electrically conduct to an external electric circuit by the methods.

[Patent document 1] Japanese Laid-Open Patent Publication No. 2002-232017

[Patent document 2] Japanese Laid-Open Patent Publication No. 1996-274378

[Patent document 3] Japanese Laid-Open Patent Publication No. 2003-37298

[Patent document 4] Japanese Laid-Open Patent Publication No. 2003-273405

As described above, for the conventional packages for housing a light-emitting element disclosed in Patent documents 1 and 2, and further depicted in FIGS. 4 and 5, the through holes for wiring (so-called via holes) 116 and 216 are formed directly below the cavities 119 and 219 for housing a light-emitting element so as to vertically pass through the insulating substrates 111 and 211.

In the case in which the insulating substrate is made of ceramics, the via hole and a wiring pattern that is electrically connected to the via hole are formed in general by filling a conductive paste mainly composed of a high melting point metal such as tungsten in a through hole formed in a green sheet by a method such as punching, by carrying out a screen printing of a conductive paste in such a manner that the exposed face of the filled portion is covered in order to form a pattern at the specified position, and by carrying out degreasing and sintering (burning).

In the case in which wiring a wiring pattern is formed on the via hole by such a method, it cannot be avoided that a peripheral section of the through hole is deformed in punching (a peripheral section is protruded or depressed depending on a direction of punching) and a high melting point metal section filled in the through holes for wiring 116 and 216 and the peripheral section thereof are protruded since a contraction behavior in sintering for the high melting point metal filled in the through hole is different from that for ceramics. As a result, the wiring pattern layers 114 and 214 that have been bonded onto the insulating substrate are not flat. It is difficult in practice that the above protrusion is suppressed by not sufficiently filling a high melting point metal into the through hole to form a flat pattern. That is because, in the case in which a filled amount is decreased, a cavity is formed on the contrary or a crack or a blow hole is generated in a conductive layer in the through hole since a contraction of the high melting point metal in burning is large, thereby causing an electrical connection failure or an increase in a conductivity.

Consequently, in the case in which a light-emitting element is mounted such protruded wiring pattern layers 114 and 214 through a bump electrode, a part of the light-emitting element is shifted or detached, or a disconnection or a conductive failure occurs in some cases, thereby preventing a part of a head light or a lighting fixture in which the light-emitting element has been installed from being lighted.

Moreover, in the case in which a wiring pattern layer 301 is arranged on the outside face of the insulating substrate 311 as disclosed in Patent document 3, and depicted in FIG. 6, a wiring distance from the wiring pattern layer 315 formed on the bottom face of the insulating substrate 311 through the wiring pattern layer 301 formed on the outside face and the wiring pattern layer 314 formed on the upper face to the light-emitting element 318 is larger depending on a size of the insulating substrate 311, thereby causing a failure such as a short circuit or a disconnection.

Moreover, since the wiring pattern layer 301 is arranged on the outside surface of the substrate, the wiring is concentrated on one section and a complicated wiring pattern layer must be used in some cases. Furthermore, the complicated wiring pattern layer causes a time taken for a circuit design to be longer and a development cost to be higher.

In addition, in the case in which the wiring pattern layer 301 is arranged on the outside surface of the substrate, the layer becomes thin due to a restriction of the fabrication method. More specifically, a substrate provided with a wiring pattern layer to be arranged on the outside surface is fabricated in general by forming a through hole in the substrate (or a green sheet that is a precursor thereof), coating a paste containing a high melting point metal with a thickness of approximately 15 μm on the inside wall of the through hole, sintering the metal paste by a cofire method, carrying out plating, and cutting the substrate along the face close to the center of the through hole as a cross section (in this case, two substrates can be obtained by one cutting). Consequently, since the wiring pattern layer 301 is comparatively thin to be approximately 20 μm even in the case in which a thickness of a plate is added, an electrical resistance is larger and a large current cannot be flown to the light-emitting element 118, thereby decreasing a luminance. Since it is preferable to form an exposed face by a plating layer, plating is carried out in advance in the above fabrication method in such a manner that a plating layer is exposed in cutting the through hole from the aspect of an efficiency.

The present invention was made in consideration of such conditions, and an object of the present invention is to provide a package for housing a light-emitting element in which a part of the light-emitting element is not shifted or detached, no disconnection or no conductive failure occurs, the light-emitting element can be reliably connected to the wiring pattern layer for connecting a light-emitting element, and it can be prevented that a part of a head light or a lighting fixture in which the light-emitting element has been installed is not lighted in the case in which the light-emitting element is mounted, and to provide a method for effectively manufacturing the package for housing a light-emitting element.

Moreover, another object of the present invention is to provide a package for housing a light-emitting element that is provided with a wiring pattern layer, capable of conducting to the light-emitting element without using a complicated wiring pattern layer, and to provide a method for manufacturing the package for housing a light-emitting element.

Furthermore, another object of the present invention is to provide a method for manufacturing the package for housing a light-emitting element, capable of simplifying a circuit design of the wiring pattern layer, lowering a development cost, and manufacturing the wiring pattern layer at a low cost.

Furthermore, another object of the present invention is to provide a package for housing a light-emitting element, capable of flowing a large current to the light-emitting element, thereby improving a luminance, and to provide a method for manufacturing the package for housing a light-emitting element.

SUMMARY OF THE INVENTION

The present inventors have thought that the problems of the prior arts described above can be solved in the case in which a via hole is formed below a reflector frame in a package for housing a light-emitting element.

More specifically, in the case in which a through hole for wiring is formed in the insulating substrate under a cavity for housing a light-emitting element as the prior art, by the reason as described before, an uneven shape occurs on the wiring pattern layer for connecting a light-emitting element, in particular on the wiring pattern layer of the area under which a through hole for wiring exists. As a result, a flatness of the wiring pattern for connecting a light-emitting element located at the cavity for housing a light-emitting element is at least 5 μm/0.5 mm square, in practice in the range of 7 to 15 μm/0.5 mm square, thereby affecting a junction condition between the light-emitting element and the wiring pattern layer. (A flatness in the present invention means a difference in a height (μm) between the highest point and the lowest point in a 0.5 mm square area of the wiring pattern layer exposed to the surface.)

On the other hand, in the case in which a through hole for wiring is formed in the insulating substrate under the reflector portion, a section in which an uneven shape occurs by the formation of the through hole for wiring is always located under the reflector portion. As a result, a flatness of the exposed portion of the wiring pattern for connecting a light-emitting element, to which the light-emitting element is bonded in practice, is less than 5 µm/0.5 mm square with an extremely high smoothness, thereby implementing a satisfactory connection with the light-emitting element.

Consequently, for such a package for housing a light-emitting element, the wiring pattern layer conducting to the light-emitting element in the cavity for housing a light-emitting element is not affected by a distortion, a part of the light-emitting element is not shifted or detached, no disconnection or no conductive failure occurs, the light-emitting element can be reliably connected to the wiring pattern layer for connecting a light-emitting element, and it can be prevented that a part of a head light or a lighting fixture in which the light-emitting element has been installed is not lighted.

Moreover, for such a package for housing a light-emitting element, it is not necessary to arrange a wiring pattern on the outside face of the insulating substrate as a prior art, and a conductive portion is formed in the through hole for wiring. As a result, an electrical resistance is smaller and a large current can be flown to the light-emitting element, thereby improving a luminance.

As a described above, the package for housing a light-emitting element in which a via hole is formed below a reflector frame is thought to have many excellent characteristics. Consequently, the present inventors have researched with might and main a method of effectively manufacturing a package for housing a light-emitting element having the above configuration.

It is thought that a package for housing a light-emitting element that is an object can be effectively manufactured by separately preparing a green sheet in which a via hole and a conductive pattern are formed at the specified position of the substrate and a green sheet that will be a reflector frame, by laminating the two green sheets, and by degreasing and sintering the laminated body. However, when such a method was tried in practice, it was found that a new problem of a junction failure between the substrate and the reflector frame occurred.

The present inventors have researched the above problems to solve them with might and main. As a result, the present inventors have obtained the knowledge that an occurrence rate of the above junction failure can be extremely reduced by disposing a paste containing a ceramics powder between a green sheet for a substrate and a green sheet for a reflector frame in the case in which the green sheet for a substrate and the green sheet for a reflector frame are laminated, and the present invention has been completed.

A package for housing a light-emitting element related to the present invention comprising:

a ceramics insulating substrate in a plate shape, a ceramics reflector frame that is bonded to the peripheral upper face of the insulating substrate and is provided with a light reflecting layer on the inside face thereof, a wiring pattern layer for connecting a light-emitting element that is formed on the upper face of the insulating substrate, and a cavity for housing a light-emitting element that is formed by the insulating substrate and the reflector frame, wherein a light-emitting element is mounted on the wiring pattern layer for connecting a light-emitting element in the cavity for housing a light-emitting element;

is characterized by further comprising:

a through hole for wiring that is positioned in the insulating substrate below the reflector frame and is formed so as to vertically pass through the insulating substrate, a conductive portion made of a conductive material that is filled in the through hole for wiring, a wiring pattern layer for connecting a light-emitting element that is formed on the upper face of the insulating substrate and is electrically connected to the conductive portion, and a wiring pattern layer for supply that is formed on the bottom face of the insulating substrate and is electrically connected to the wiring pattern layer for connecting a light-emitting element through the conductive portion.

A method for manufacturing the package for housing a light-emitting element related to the present invention is characterized by comprising:

(a) a ceramics insulating substrate in a plate shape, (b) a ceramics reflector frame that is bonded to the peripheral upper face of the insulating substrate and is provided with a light reflecting layer on the inside face thereof, (c) a cavity for housing a light-emitting element that is formed by the insulating substrate and the reflector frame, (d) a conductive portion made of a conductive material that is filled in the through hole for wiring that is formed so as to vertically pass through the insulating substrate, (e) a wiring pattern layer for connecting a light-emitting element that is formed on the upper face of the insulating substrate and is electrically connected to the conductive portion, and (f) a wiring pattern layer for supply that is formed on the bottom face of the insulating substrate and is electrically connected to the wiring pattern layer for connecting a light-emitting element through the conductive portion, wherein a light-emitting element is mounted on the wiring pattern layer for connecting a light-emitting element in the cavity for housing a light-emitting element;

is characterized by comprising the following steps of A, B, C, and D.

A: Step of forming a through hole for wiring, into which a conductive paste that is the conductive portion (d) is filled, in the green sheet in a plate shape that is a precursor of the ceramics insulating substrate (a) in a plate shape in such a manner that the through hole is positioned below the ceramics reflector frame (b), and preparing a green sheet for a substrate that is made of a green sheet in which a conductive paste later that will be the wiring pattern layer for connecting a light-emitting element and a conductive paste later that will be the wiring pattern layer for supply are formed on the upper and bottom faces, respectively, B: Step of preparing a green sheet for a reflector frame that is a precursor of the ceramics reflector frame (b), C: Step of laminating the green sheet for a substrate and the green sheet for a reflector frame through a paste layer containing a ceramics powder between the both green sheets, and D: Step of heating the laminate obtained in the step C to degrease and sinter the laminate.

For the package for housing a light-emitting element and the method for manufacturing the package for housing a light-emitting element related to present invention, a through hole for wiring is formed in the green sheet for a substrate that is a base for forming the insulating substrate at the position below the reflector frame in such a manner that the through hole vertically passes through the insulating substrate by punching or the like.

A metallization paste such as a tungsten paste is then filled into the through hole for wiring of the insulating substrate formed as described above by press fitting or the like, and a similar metallization paste is printed on the upper and bottom faces of the insulating substrate by screen printing or the like to form the paste layers that will be the wiring pattern layer for connecting a light-emitting element and the wiring pattern layer for supply, respectively.

On the other hand, separately from this, a hole is formed, for instance, by punching a green sheet in a plate shape and a metallization paste is coated on the inside wall of the hole to prepare a green sheet for a reflector frame.

The green sheet for a substrate and the green sheet for a reflector frame are then laminated and bonded through a paste layer containing a ceramics powder between the both green sheets in such a manner that a cavity for housing a light-emitting element is formed. In the case in which the paste is disposed between the both green sheets, the paste can be coated on the junction face of any one of the both green sheets. It is not necessary to coat the paste when bonding the both green sheets, and the paste can be coated on the bottom face (junction face) of the green sheet for forming a reflector frame before forming the hole for instance.

The ceramics substrate and the reflector frame are integrated with each other by heating, degreasing, and sintering the laminate, thereby obtaining the package for housing a light-emitting element provided with the cavity for housing a light-emitting element.

Moreover, by bonding a metal such as gold, silver, nickel, platinum, rhodium, aluminum or the like on the surface of the metallization layer bonded to the inside wall of the cavity for housing a light-emitting element by a plating method or a deposition method, it is possible to provide the package for housing a light-emitting element and the method for manufacturing the package for housing a light-emitting element, capable of uniformly and effectively emitting a light, which has been emitted from a light-emitting element housed in the cavity for housing a light-emitting element, toward the outside by the light reflecting layer on the inside wall of the reflector frame.

For the package for housing a light-emitting element and the method for manufacturing the package for housing a light-emitting element related to present invention, in the case in which the through hole for wiring is disposed at 200 µm or larger in an outer direction from the inside face of the reflector frame on the insulating substrate and at 200 µm or larger in an inter direction from the outside face of the reflector frame in the above process for forming the through hole for wiring, even if an uneven shape occurs around the through hole for wiring due to the formation of the through hole for wiring, a flatness of the wiring pattern for connecting a light-emitting element at the section located below the cavity for housing a light-emitting element can be reliably less than 5 µm/0.5 mm square.

Moreover, for the package for housing a light-emitting element and the method for manufacturing the package for housing a light-emitting element related to present invention, it is preferable to form the insulating substrate, or the insulating substrate and the reflector frame by at least one kind of ceramics selected from the nitride ceramics, in particular aluminum nitride ceramics, silicon nitride ceramics, and boron nitride ceramics. Since a thermal conductivity of the nitride ceramics is comparatively satisfactory, a heat from a light-emitting element can be radiated outside without being stored in the package for housing a light-emitting element, thereby reducing a degree of risk of damaging the light-emitting element due to a heat. Among the above ceramics, aluminum nitride ceramics is most preferable since the thermal conductivity thereof is at least 170 W/m·K and a heat radiation thereof is excellent.

According to the present invention, there can be effectively manufactured a package for housing a light-emitting element in which a part of the light-emitting element is not shifted or detached, no disconnection or no conductive failure occurs, and the light-emitting element can be reliably connected to the wiring pattern layer for connecting the light-emitting element in the case in which the light-emitting element is mounted.

Moreover, according to the present invention, there can be effectively manufactured a package for housing a light-emitting element that is provided with a wiring pattern layer, capable of conducting to the light-emitting element without using a complicated wiring pattern layer.

Furthermore, according to the present invention, a through hole for wiring does not exist under the light-emitting element in practice and a section under the light-emitting element can be made of ceramics with a high thermal conductivity, thereby improving a heat radiation.

In addition, a circuit design of the wiring pattern layer can be simplified, a development cost can be lowered, and a package for housing a light-emitting element can be manufactured at a low cost.

Furthermore, according to the present invention, there can be effectively manufactured a package for housing a light-emitting element in which a large current can be flown to the light-emitting element, thereby improving a luminance.

BEST MODE OF CARRYING OUT THE INVENTION

Several presently preferred embodiments of the present invention will be described below in detail with reference to the drawings.

Figure 1:
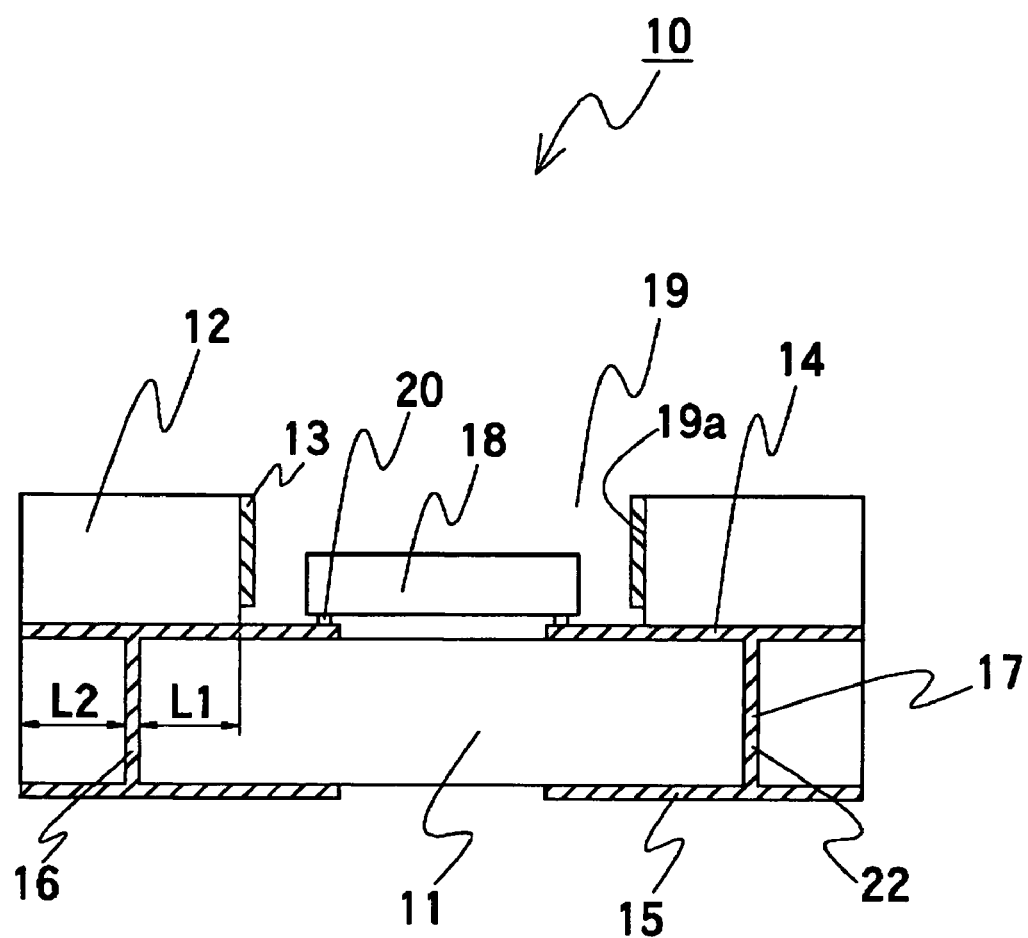
FIG. 1 is a cross-sectional view showing an embodiment of a package for housing a light-emitting element related to the present invention.

FIG. 1 is a cross-sectional view showing a first embodiment of a package for housing a light-emitting element related to the present invention.

In FIG. 1, a numeral 10 represents a package for housing a light-emitting element related to the present invention as a whole. The package for housing a light-emitting element 10 is provided with an insulating substrate 11 made of ceramics in an almost rectangular plate shape and a reflector frame 12 made of ceramics bonded on the peripheral upper face of the insulating substrate 11. Moreover, a cavity 19 for housing a light-emitting element 18 is formed by the insulating substrate 11 and the reflector frame 12 at the center thereof.

The insulating substrate 11 configured as described above functions as a support body for supporting the light-emitting element 18 and is provided with the cavity 19 for housing a light-emitting element 18 on the upper face.

In this case, a known ceramics material can be adopted as the insulating substrate 11. For instance, there can be used (i) oxide ceramics such as aluminum oxide ceramics, silicon oxide ceramics, calcium oxide ceramics, and magnesium oxide ceramics, (ii) nitride ceramics such as aluminum nitride ceramics, silicon nitride ceramics, and boron nitride ceramics, and (iii) beryllium oxide, silicon carbide, mullite, and glass borosilicate. The insulating substrate 11 is a ceramics sintered body in which the above ceramics material has been sintered.

Among the above materials, nitride ceramics such as aluminum nitride ceramics, silicon nitride ceramics, and boron nitride ceramics, in particular, aluminum nitride ceramics is preferable since it has a comparatively high thermal conductivity and can effectively radiate a heat generated from the light-emitting element.

As shown in FIG. 1, a wiring pattern layer for supply 15 that is electrically connected to a circuit board (not shown) is formed in a bonded manner on the bottom face of the insulating substrate 11. The wiring pattern layer for supply 15 is composed of a plurality of independent pattern layers (not electrically connected to each other). The number of the pattern layers is equivalent to that of electrodes formed on the housed light-emitting element 18 (two electrodes for one light-emitting element in general).

The wiring pattern layer for supply 15 can be disposed only on a flat face, can be formed on both a flat face and an edge face for easy soldering, or can be patterned in order to connect by using a solder bump. In the case in which a patterning for a solder bump is carried out, it is preferable to form a ceramics layer functioning as both an insulating layer and a solder barrier on the surface of the wiring pattern layer for supply 15.

A wiring pattern layer 14 for connecting a light-emitting element that is arranged from the peripheral section to a cavity 19 for housing a light-emitting element is formed in a bonded manner on the upper face of the insulating substrate 11. The wiring pattern layer 14 for connecting a light-emitting element is also composed of a plurality of independent pattern layers (not electrically connected to each other). The number of the wiring pattern layers is equivalent to that of electrodes formed on the housed light-emitting element 18 (two electrodes for one light-emitting element in general).

A through hole for wiring 16 that penetrates from the upper face to the bottom face is formed in the insulating substrate 11 at the position below a reflector frame 12. A conductive material 17 is filled in the through hole for wiring 16, thereby forming a conductive portion 22. The wiring pattern layer 14 for connecting a light-emitting element is electrically conducted to the wiring pattern layer for supply 15 through the conductive portion 22.

By the above configuration, there is formed a conductive circuit arranged from the wiring pattern layer for supply 15 through the conductive portion 22 to the wiring pattern layer 14 for connecting a light-emitting element. In the cavity 19 for housing a light-emitting element in the package 10 for housing a light-emitting element, the light-emitting element 18 such as a light emitting diode is electrically connected (mounted) to the wiring pattern layer 14 for connecting a light-emitting element through a bump electrode 20 by ultrasonic welding for instance.

While the number of light-emitting elements 18 to be mounted can be properly determined, it is preferable to be in the range of one to four elements, in particular, one or two elements.

In the case in which the light-emitting element 18 is connected to the wiring pattern layer 14 for connecting a light-emitting element, each electrode formed on the light-emitting element 18 is connected to one wiring pattern layer 14 for connecting a light-emitting element in such a manner that a short circuit in carrying currents can be prevented.

As shown in FIG. 1, the through hole for wiring 16 is preferably disposed in such a manner that a distance L1 from the inside face of the reflector frame 12 in an outer direction is preferably at least 200 µm, more preferably at least 500 µm, and a distance L2 from the outside face of the reflector frame 12 in an inter direction is preferably at least 200 µm, more preferably at least 500 µm.

A diameter of the through hole for wiring 16 is preferably in the range of 50 to 500 µm, more preferably in the range of 100 to 200 µm. By this configuration, a comparatively large current in the range of 0.1 to 5 A for instance can be flown to the light-emitting element 18, thereby improving a luminance of the light-emitting element 18. A shape of the through hole for wiring 16 is not restricted in particular, and it can be properly selected depending on an amount of currents in such a manner that it is almost circular, elliptic, rectangular, or the like. Moreover, the number of the through holes for wiring 16 is not restricted in particular, and it can be properly selected depending on an amount of currents and so on. Furthermore, there is no problem even in the case in which the through hole for wiring 16 and a wiring pattern layer 301 for soldering are disposed in the same package.

In the case in which a large current is flown, it is preferable to form at least two through holes for wiring 16, more preferably the range of two to six through holes for wiring 16 for one wiring pattern layer for connecting a light-emitting element. More specifically, it is preferable to connect one wiring pattern layer 14 for connecting a light-emitting element and one wiring pattern layer for supply 15 by at least two conductive materials 17, preferably the range of two to six conductive materials 17.

In the case in which a plurality of through holes for wiring 16 is formed for one wiring pattern layer for connecting a light-emitting element in the package related to the present invention, the through hole for wiring 16 does not exist below the bottom face of the cavity 19 for housing a light-emitting element. Consequently, in the case in which a section under the cavity 19 for housing a light-emitting element is made of ceramics with a high thermal conductivity, a thermal conductivity of the section is higher than that of a high melting point metal, thereby suitably improving a heat radiation.

In this case, for all through holes for wiring 16, a distance L1 is preferably at least 200 µm, more preferably at least 500 µm.

The conductive material 17 is made of a metal such as tungsten, molybdenum, copper, and silver. The conductive portion 22 is formed by filling a conductive paste containing a powder of the metal into the through hole for wiring 16 by printing, press fitting, or the like, and by heating the conductive paste. Among the above metals, it is preferable to use a high melting point metal such as tungsten.

As a material forming the wiring pattern layer 14 for connecting a light-emitting element and the wiring pattern layer for supply 15, a material equivalent to that of the conductive material 17 can be used. A method of forming the wiring pattern layer 14 for connecting a light-emitting element and the wiring pattern layer for supply 15 is not restricted in particular, and there can be adopted a known pattern formation method such as (i) a method of printing a pattern of a conductive paste containing a high melting point metal such as tungsten on the insulating substrate, then simultaneously burning them to form a high melting point metal layer, and plating nickel, silver, and gold thereon, and (ii) a method of forming a metal thin film pattern on the insulating substrate by a sputtering method.

By bonding a metal having an excellent corrosion resistance such as nickel and gold with a thickness in the range of 1 to 20 μm on the surface of the wiring pattern layer 14 for connecting a light-emitting element, an oxidation corrosion of the conductive material 17 can be effectively prevented, and there can be strengthened a connection between the light-emitting element 18 and the wiring pattern layer 14 for connecting a light-emitting element. Consequently, a nickel plating layer and a gold plating layer are bonded in general in this order on the surface of the wiring pattern layer 14 for connecting a light-emitting element by the electrolytic plating method or the electroless plating method.

The reflector frame 12 has a composition equivalent to that of the insulating substrate 11 or is made of a ceramics material different from a material of the insulating substrate 11, and is sintered on the upper face of the insulating substrate 11 to be integrated with the insulating substrate 11. The reflector frame 12 is provided with a through hole 19a in an almost circular or square shape for housing the light-emitting element 18 at the center. With the through hole 19a, a cavity 19 for housing a light-emitting element is formed by the insulating substrate 11 and the reflector frame 12. While a shape of the through hole 19a is not restricted, in the case in which the shape is almost circular, lights emitted from the light-emitting element 18 housed in the through hole 19a are uniformly reflected in all directions at the inside wall of the almost circular through hole 19a, thereby preferably emitting lights uniformly outside.

A light reflecting layer 13 in which a plating metal layer made of nickel or gold is laminated on a metallization metal layer formed by coating a metal powder paste such as tungsten, molybdenum, copper, and silver is formed on the inside wall of the through hole 19a of the reflector frame 12. In this case, the light reflecting layer 13 is not formed on the entire inside wall of the through hole 19a of the reflector frame 12, but is formed in a bonded manner at a specified distance from the bottom face of the cavity 19 for housing a light-emitting element, thereby preferably preventing a short circuit between the light reflecting layer 13 and the wiring pattern layer 14 for connecting a light-emitting element.

The plating metal layer of the light reflecting layer 13 functions as a reflecting material for reflecting and dispersing a light emitted from the light-emitting element 18 housed in the through hole 19a, that is, in the cavity 19 for housing a light-emitting element. A material forming the light reflecting layer is not restricted to the above metals. A metal such as aluminum can also be bonded by deposition, and a substance having a high light reflectance other than a metal, such as a white resin, can also be used. In the case in which a deposition metal or a white resin is used as a material of the light reflecting layer, it is not necessary in particular to form a high melting point metal such as tungsten as a substrate. For instance, a metal can be directly deposited on the ceramics, and a white resin layer can also be bonded by using an adhesive.

Figure 2:
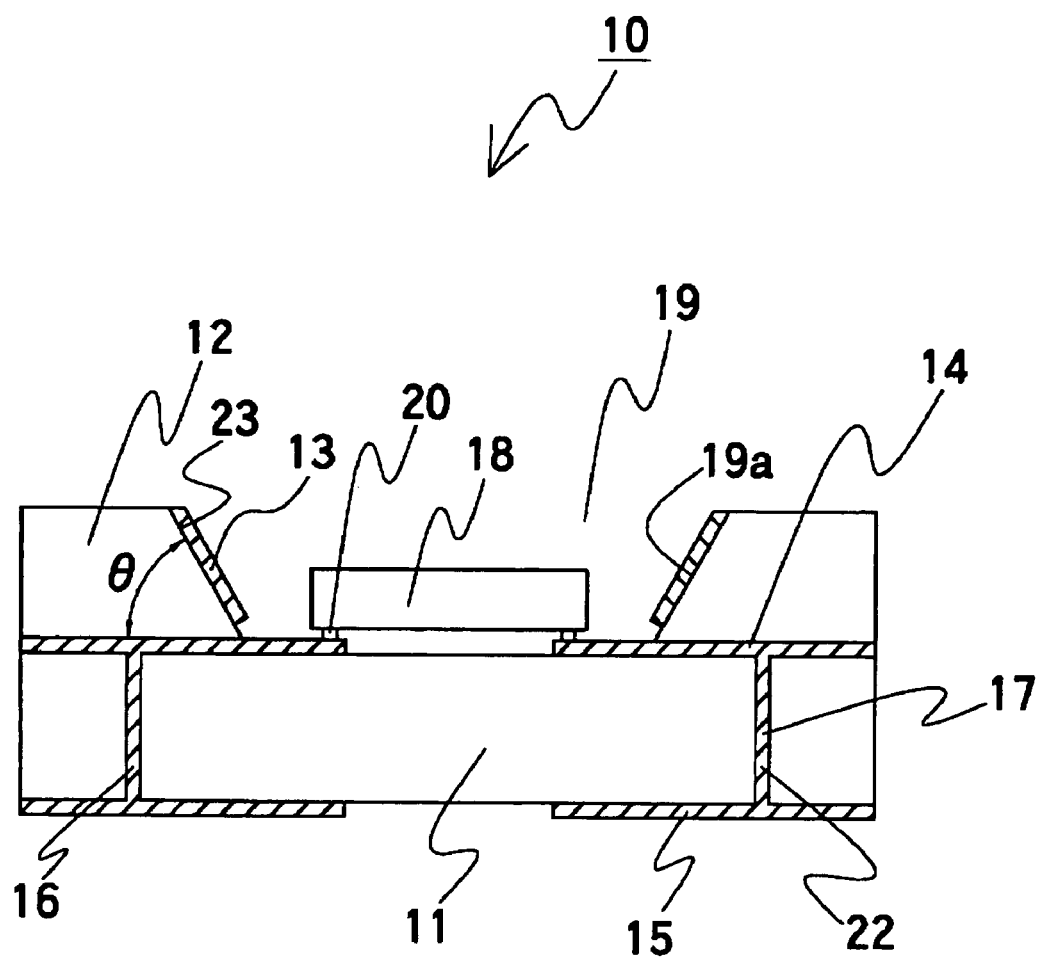
FIG. 2 is a cross-sectional view showing another embodiment of a package for housing a light-emitting element related to the present invention.

As shown in FIG. 2, in order to uniformly and effectively irradiate lights emitted from the light-emitting element 18, it is preferable to properly change an angle θ of the light reflecting layer 13 and to reflect the lights depending on the usage conditions. More specifically, it is preferable that the inside face of the reflector frame 12 is inclined inside in such a manner that the inside face is a tapered face.

In this case, as shown in FIG. 2, the angle θ formed by a tapered face 23 inside the reflector frame 12 and the wiring pattern layer 14 for connecting a light-emitting element is preferably in the range of 45 to 75 degrees in such a manner that a light emitted from the light-emitting element 18 is satisfactorily reflected externally.

As described above, since a degree in which a light emitted from the light-emitting element 18 is reflected depends on a position to be mounted and an application, it is possible to provide a package for housing a light-emitting element depending on the usage conditions by properly adjusting the angle θ.

The package 10 for housing a light-emitting element having the above configuration can be used as a light emitting apparatus by mounting (installing) the light-emitting element 18 on the wiring pattern layer 14 for connecting a light-emitting element in the cavity 19 for housing a light-emitting element of the insulating substrate 11 through a plate electrode 21 for instance in such a manner that the light-emitting element 18 is electrically connected to the wiring pattern layer 14, filling a transparent resin such as an epoxy resin and a silicone resin into the cavity 19 for housing a light-emitting element in which the light-emitting element 18 has been housed in order to airtightly seal the light-emitting element 18, properly burying a fluorescent material or the like in a sealing resin, and disposing a lens.

A bump electrode 20 is attached to the light-emitting element 18 by ultrasonic welding for instance in advance, and the light-emitting element 18 is connected to the wiring pattern layer in such a manner that the wiring face faces downward for the connection between the light-emitting element 18 and the wiring pattern layer 14 for connecting a light-emitting element in the above embodiment. However, the light-emitting element 18 can also be bonded to the insulating substrate 11 by an adhesive in advance, and the terminal of the light-emitting element 18 can be connected by a bonding wire such as a gold wire to the wiring pattern layer 14 for connecting a light-emitting element that has been bonded to the upper face of the insulating substrate 11.

Moreover, in the case in which the package 10 for housing a light-emitting element is mounted to another circuit board, there can be formed an electrode that is electrically connected to the circuit board (an electrode for supply) on the bottom face of the wiring pattern layer for supply 15. In this case, the number of electrodes is not restricted in particular, and can be properly determined depending on a circuit pattern of the circuit board. In the case in which an electrode for supply is formed on the wiring pattern layer for supply 15, it is preferable to form in a bonded manner an insulating layer on the area in which an electrode is not formed on the wiring pattern layer for supply 15.

The following describes a method for manufacturing the package 10 for housing a light-emitting element with the above configuration related to the present invention (manufacturing method related to the present invention).

Figure 3:
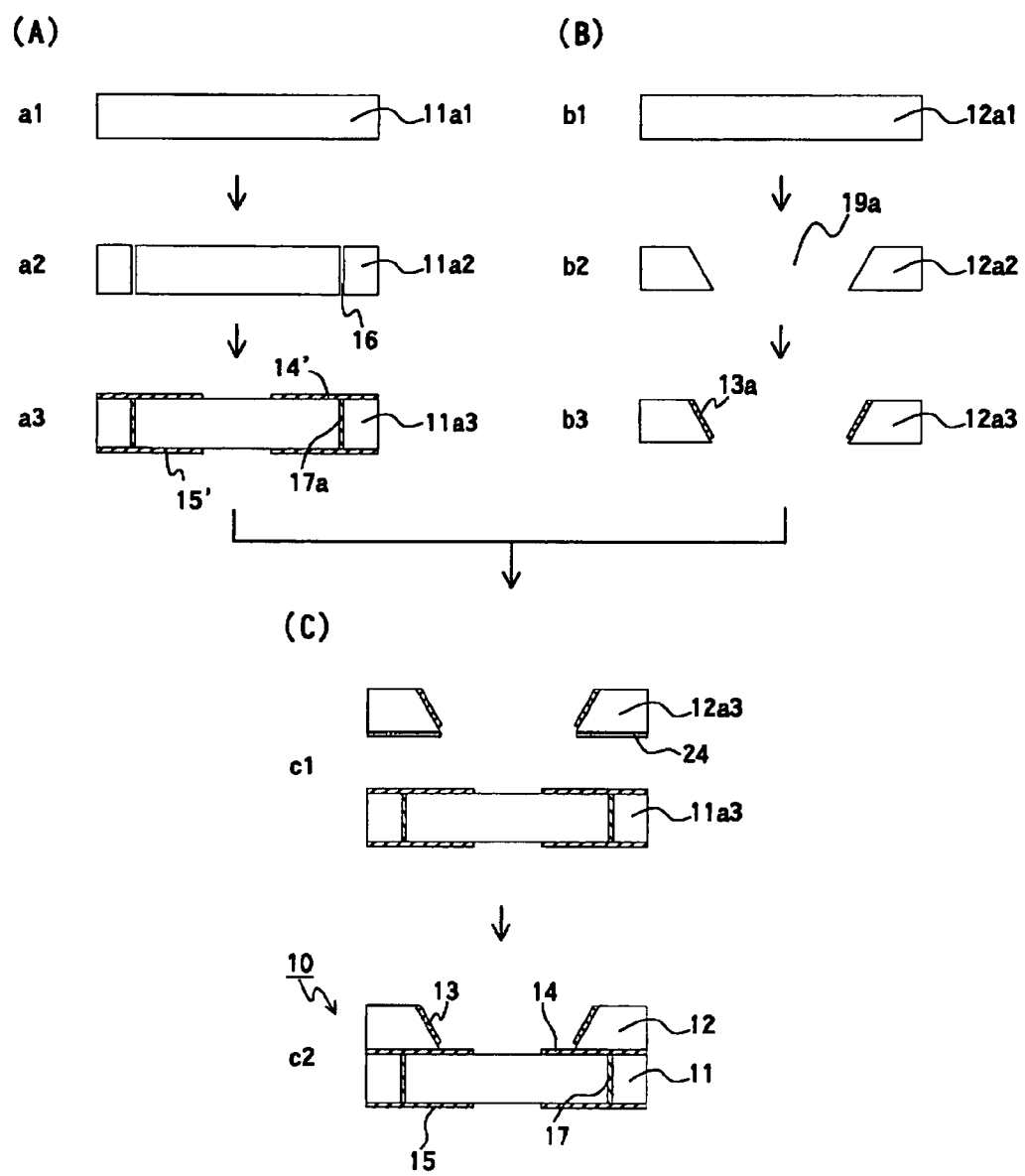
FIGS. 3(A)-3(C) are cross-sectional views of the several process steps illustrating a manufacturing method related to the present invention for manufacturing the package for housing a light-emitting element of the present invention.

FIGS. 3(A) to 3(C) are cross-sectional views of each process for illustrating a manufacturing method for manufacturing the package for housing a light-emitting element as shown in FIG. 1.

As shown in FIGS. 3(A) and 3(B), there are prepared a green sheet 11a3 for a substrate that is a precursor of the insulating substrate 11 (means a raw material substrate that will be the insulating substrate 11 finally) and a green sheet 12a3 for a reflector frame that is a precursor of the reflector frame 12 (means a raw material substrate that will be the insulating substrate 12 finally).

A preparation of the green sheet 11a3 for a substrate is carried out as shown in FIGS. 3(A)a1 to 3(A)a3. More specifically, as shown in FIG. 3(A)a1, there is prepared a green sheet 11a1 in a plate shape that is a base of the insulating substrate 11. Such a green sheet 11a1 is formed by adding and mixing an organic solvent such as alcohol and toluene, a suitable organic binder, a plasticizer such as a glycerin compound, or a dispersing agent to a ceramics raw material powder and a sintering aid to be in a slurry state, and by making a sheet shape properly with a necessary thickness by using a sheet formation technique such as a doctor blade method.

As a raw material to be used for preparing the green sheet, a substance that is used in general in the case in which a green sheet is manufactured in a field of ceramics can be used without a restriction in particular. More specifically, there can be adopted a known ceramics powder as a ceramics raw material powder. For instance, there can be used a powder of (i) oxide ceramics such as aluminum oxide ceramics, silicon oxide ceramics, calcium oxide ceramics, and magnesium oxide ceramics, (ii) nitride ceramics such as aluminum nitride ceramics, silicon nitride ceramics, and boron nitride ceramics, and (iii) beryllium oxide, silicon carbide, alumina, mullite, boron nitride, and glass borosilicate. However, from the aspect of a thermal conductivity, it is suitable to use a nitride ceramics powder such as aluminum nitride ceramics, silicon nitride ceramics, and boron nitride ceramics. In general, such a ceramics powder is used together with a sintering aid usually used depending on the type thereof.

As an organic binder, polyvinyl butyral, ethyl cellulose, and an acrylic resin are used, and poly n_butyl methacrylate and polyvinyl butyral are suitably used in particular since a formation property of a green sheet becomes satisfactory.

In the manufacturing method related to the present invention, as a green sheet for a substrate, from the aspect of a thermal conductivity, as a ceramics powder, it is suitable to use a green sheet for nitride ceramics that is formed by using a nitride ceramics powder containing a sintering aid as a ceramics raw material powder, in particular, a green sheet for aluminum nitride that is formed by using an aluminum nitride powder containing a sintering aid (for instance, yttria or calcia) as a raw material powder.

As shown in FIG. 3(A)a2, a through hole for wiring 16 that penetrates from the upper face the insulating substrate 11 to the bottom face is punched by using a punching metal mold in the green sheet at the position below the reflector frame 12. In this case, as described in the description of the package for housing a light-emitting element related to the present invention, it is preferable to form at least two through holes for wiring 16, more preferably the range of two to six through holes for wiring 16 for one wiring pattern layer for connecting a light-emitting element. In addition, for all through holes for wiring 16, a distance L1 is preferably at least 200 μm, more preferably at least 500 μm.

As shown in FIG. 3(A)a3, a conductive paste 17a for the conductive material 17 is filled into the through hole for wiring 16 of the green sheet 11a2 provided with the through hole for wiring 16 by press fitting, screen printing, or the like to form the conductive portion 22. A conductive paste layer 15' that will be a wiring pattern layer for supply 15 that is electrically connected to a circuit board (not shown) is then formed on the bottom face of the insulating substrate 11, and a conductive paste layer 14' that will be a wiring pattern layer 14 for connecting a light-emitting element that is arranged from the peripheral section to a cavity 19 for housing a light-emitting element is formed on the upper face of the insulating substrate 11 both by printing and coating the paste on the necessary wiring pattern by using a screen printing method or the like. In this case, as a material forming the conductive paste layer 14' and the conductive paste layer 15', there can be used a material equivalent to that of the conductive paste 17a for the conductive material 17.

As a method of forming the wiring pattern layer 14 for connecting a light-emitting element and the wiring pattern layer for supply 15, there can be adopted a known pattern formation method such as (i) a method of plating nickel, silver, and gold on a high melting point metal layer formed after the sintering (simultaneous-burning) in a process C that will be described later, and (ii) a method of forming a high melting point metal layer on the insulating substrate by the simultaneous burning method similarly to the above method and forming a metal thin film pattern thereon by a sputtering method.

A preparation of the green sheet 12a3 for a reflector frame is carried out as shown in FIGS. 3(B)b1 to 3(B)b3. More specifically, as shown in FIG. 3(B)b1, there is prepared a green sheet 12a1 in a plate shape that is a base of the reflector frame. The preparation of the green sheet can be carried out similarly to the preparation of the green sheet 11a1. While a kind and a blended amount of each component such as a ceramics powder to be used are not restricted in particular, they are suitably equivalent to the case of the preparation of the green sheet 11a1 from the aspect of an adhesion.

As shown in FIG. 3(B)b2, a through hole 19a for the cavity 19 for housing a light-emitting element is punched in the green sheet 12a1 by using a punching metal mold. In this case, as shown in the figure, the inside wall of the through hole 19a formed in the ceramics green sheet 12a1 for the reflector frame 12 is tapered from one face to another face of the ceramics green sheet 12a. As described above, by forming the through hole 19a in such a manner that the inside wall of the through hole 19a spreads from one major face toward another major face of the ceramics green sheet 12a at a constant angle, the through hole 19a can be formed in such a manner that the inside wall of the through hole 19a for the reflector frame 12 spreads outside toward the upper face of the insulating substrate 11 at a constant angle. As shown in FIG. 3(B)b3, a metal paste 13a for a light reflecting layer 13 is then printed and coated on the inside wall of the through hole 19a by using a screen printing method similarly.

In order to manufacture the package for housing a light-emitting element related to the present invention, a green sheet 11a3 for a substrate and a green sheet 12a3 for a reflector frame, which have been prepared as described above, are bonded to each other. In this case, while any method can be carried out as a bonding method, it is preferable to laminate the both green sheets through a paste containing a ceramics powder (hereafter also referred to as adhesive paste) in the process C from the aspect of a reliable adhesion as shown in FIG. 3(C)c1.

As an adhesive paste to be used in such a case, there is suitably used a material in which an organic solvent, an organic binder, a plasticizer, or a dispersing agent is added and mixed to a ceramics powder. There can be used without a restriction each component that can be used in the case in which the green sheet 11a1 for a substrate and the green sheet 12a1 for a frame are prepared. However, it is preferable to use a ceramics powder that has been used when any one of the above green sheets is prepared. It is preferable to use the same component for other components. From the aspect of a printing property and an adhesion, it is preferable to blend a little large amount of the organic solvent and to make a viscosity at 25° C. to be in the range of 500 to 5000 P.

While a method of disposing an adhesive paste between the both green sheets is not restricted in particular, it is preferable to adopt the method of coating the adhesive paste on the junction face of the green sheet 12a3 for a frame and of bonding both the green sheets from the aspect of obtaining a manipulation property and a reliable adhesion effect. As a coating method, it is preferable to adopt the printing method in order to obtain a uniform film thickness. In the case in which the green sheet for a substrate and the green sheet for a frame are laminated, as a method of simply aligning an adhesive paste, it is preferable to coat an adhesive paste on the entire face of a green sheet in a plate shape before forming a reflector frame or on the section larger than an area including a frame portion of a green sheet in a plate shape before forming a reflector frame and to form a hole for forming a frame since an area of the adhesive paste is equivalent to a size of the frame. In this case, a thickness of the adhesive layer is preferably in the range of 30 to 400%, in particular in the range of 100 to 300%, of a thickness of the conductive paste layer that is the wiring pattern layer for connecting a light-emitting element that is formed in the above described process A. By implementing such a thickness, a paste viscosity can be adjusted to the suitable range as described before, and it can be prevented that an excess adhesive paste is easily flown to the cavity in which a conductive paste layer is not formed under the green sheet 12a3 for a frame in bonding and that a cavity is formed at the interface between the both sheets after bonding (laminating), thereby obtaining a higher adhesion.

In the case in which the green sheet 11a3 and the green sheet 12a3 are laminated, the both green sheets are preferably superposed and compressed at a pressure in the range of approximately 10 to 100 KPa while being heated at a temperature in the range of approximately 60 to 140° C.

The laminate obtained as described above is heated to degrease a green material as shown in FIG. 3(C)c2, and the green sheets and the conductive pastes 17a and 13a coated thereon are burned at a high temperature, thereby obtaining a sintered body in which the insulating substrate 11 and the reflector frame 12 are sintered and integrated with each other.

In this case, a green material is degreased by carrying out a heat processing of the green material in an ambient atmosphere of an oxidizing gas such as oxygen and air, a reducing gas such as hydrogen, an inert gas such as argon and nitrogen, carbon dioxide and a mixed gas therewith, or a humidified gas to which a steam is mixed. The degreasing conditions can be properly selected from temperatures in the range of 250 to 1200° C. and retention times in the range of 1 to 1000 minutes depending on a kind and an amount of an organic component contained in the green material.

For sintering carried out subsequently to such degreasing, conditions that are adopted in general are properly adopted depending on a kind of the green sheet (more specifically, a kind of the ceramics powder used as a raw material thereof). For instance, in the case in which there is used a green sheet for aluminum nitride (a green sheet containing an aluminum nitride powder as a major component of an inorganic component), burning can be carried out at a temperature in the range of 1600 to 2000° C., preferably in the range of 1750 to 1850° C., for the range of 1 to 20 hours, preferably the range of 2 to 10 hours. The sintering can be carried out in an ambient atmosphere of a non oxidizing gas such as a nitrogen gas under the normal pressure. A thermal conductivity of the obtained sintered body is 170 W/m·K or higher, and can be 200 W/m·K or higher in the case in which the conditions are further restricted.

The package for housing a light-emitting element as shown in FIG. 1 is completed by properly bonding a plating metal layer or a deposition metal layer such as nickel, gold, platinum, palladium, rhodium, silver, aluminum or the like onto the conductive portion of the sintered body, that is, the exposed face of the wiring pattern layer 14 for connecting a light-emitting element and the wiring pattern layer for supply 15 by the electrolytic plating method or the electroless plating method.

The present invention is not restricted to the above embodiment, and can be properly modified to be used depending on an individual usage condition.

From the aspect of a production efficiency, it is preferable to adopt the method of preparing a large green sheet in which a plurality of green sheets for a substrate and a plurality of green sheets for a reflector frame are connected to each other (a plurality of green sheet patterns for a substrate and a plurality of green sheet patterns for a reflector frame are formed in one green sheet), of bonding, degreasing, and sintering the both green sheets, and of cutting a plurality of packages. Such a mode is included in the present invention as a matter of course.

Embodiment 1

An yttrium oxide 5.0 weight portion, a tetraglycerin monophorate 1.0 weight portion, a toluene 50 weight portion, a poly n_butyl methacrylate 13 weight portion, a dibutyl phthalateare 4.2 weight portion, and a butyl acetate 5 weight portion were added and mixed to an aluminum nitride powder 100 weight portion to obtain a white slurry. By using the obtained slurry, two green sheets having a thickness of 0.4 mm and a specified area were fabricated by a doctor blade method. One of the two green sheets was a green sheet 11a1 for a substrate and another green sheet was a green sheet 12a1 for a reflector frame.

A through hole 16 of φ0.2 mm was formed in the green sheet 11a1 for a substrate by using a punching metal mold, and a tungsten paste was filled into the through hole 16. Subsequently, a similar tungsten paste (a thickness of 15 μn) was printed on the upper and bottom faces of the green sheet for a substrate, and the paste layers that cover the both exposed edge faces of the through hole (a conductive paste layer 14' and a conductive paste layer 15') were formed to obtain a green sheet 11a3 for a substrate. The through hole 16 was formed at the position that is covered by the bottom face of a green sheet 12a3 for a reflector frame in the case in which the green sheet 12a3 in which a hole 19a was formed was superposed on the green sheet 11a3 (at the position below the frame). The conductive paste layer 14' was formed in such a manner that a part of the conductive paste layer 14' was disposed under the hole 19a (more specifically, a part of the conductive paste layer 14' was exposed to the bottom face of the cavity 19 for housing a light-emitting element).

Separately from this, an aluminum nitride paste (an adhesive paste with a viscosity at 25° C. is 1000 P) that was prepared by adding an yttrium oxide 5 weight portion, an ethyl cellulose 20 weight portion, and a terpineol 50 weight portion to an aluminum nitride powder 100 weight portion was coated on the entire bottom face of the green sheet 12a1 for a reflector frame by the printing method in such a manner that a thickness was 20 μm. After that, the green sheet was punched by a punching metal mold of a 3 mm square to form a through hole (a hole 19a), and a tungsten paste was coated on the inside wall of the obtained hole 19a to obtain a green sheet 12a3 for a reflector frame.

The green sheet 12a3 for a reflector frame was aligned, superposed, and laminated on the green sheet 11a3 for a substrate fabricated as described above. Subsequently, the laminated formed body was heated and degreased at 850° C.

for two hours in an ambient atmosphere of a hydrogen gas containing a moisture content. After degreasing, the formed body was heated and sintered at 1800° C. for five hours in an ambient atmosphere of nitrogen.

After cooling, an Ni plate and an Au plate were formed in this order on the tungsten metallization layer of the taken sintered body, thereby manufacturing the package for housing a light-emitting element related to the present invention.

For the obtained package, in the case in which a flatness of the wiring pattern layer 14 for connecting a light-emitting element exposed to the bottom face of the cavity 19 for housing a light-emitting element was measured by a surface roughness tester, the flatness was in the range of 2 to 3 μm. The flatness means a difference in a height between the highest point and the lowest point in the case in which a substrate is disposed on a flat platform and a height of each point is measured in any 0.5 mm square area on one metallization layer in the substrate.

Moreover, in the case in which the wire bonding with an Au wire of φ25 μm was carried out to the wiring pattern layer 14 for connecting a light-emitting element exposed to the bottom face of the cavity 19 for housing a light-emitting element by using a wire bonding apparatus, and a strength thereof (a strength at wire breaking) was measured by a tensile testing machine, the strength was in the range of 8 to 12 g.

Furthermore, in the case in which the package was cut vertically by using a cutter provided with a diamond blade and the cross section was observed by an SEM, a void was not found at the junction face between the substrate and the reflector frame.

Comparison Example 1

A package for housing a light-emitting element was manufactured similarly to Embodiment 1 except that a through hole 16 was formed below a hole 19a of the green sheet for a reflector frame (more specifically, at the bottom face of the cavity 19 for housing a light-emitting element) in the case in which the green sheet 12a3 for a reflector frame was superposed. For the obtained package, in the case in which an evaluation similar to Embodiment 1 was carried out, a flatness of the wiring pattern layer 14 for connecting a light-emitting element exposed to the bottom face of the cavity 19 for housing a light-emitting element was in the range of 7 to 15 μm. Moreover, although the wire bonding was carried out similarly to Embodiment 1, it was impossible to connect a wire to the metallization portion.

Comparison Example 2

A package was obtained similarly to Embodiment 1 except that a junction between the green sheet for a substrate and the reflector frame was carried out without using an adhesive paste. In the case in which the obtained package was cut vertically by using a cutter provided with a diamond blade and the cross section was observed by an SEM, a void was found at the junction face between the substrate and the reflector frame.

The invention claimed is:

1. A method for manufacturing the package for housing a light-emitting element comprising:
   (a) a nitride ceramics insulating substrate in a plate shape,
   (b) a nitride ceramics reflector frame that is bonded to the peripheral upper face of the insulating substrate and is provided with a light reflecting layer on the inside face thereof,
   (c) a cavity for housing a light-emitting element that is formed by the insulating substrate and the reflector frame,
   (d) a conductive portion made of a conductive material that is filled in the through hole for wiring that is formed so as to vertically pass through the insulating substrate,
   (e) a wiring pattern layer for connecting a light-emitting element that is formed on the upper face of the insulating substrate and is electrically connected to the conductive portion, and
   (f) a wiring pattern layer for supply that is formed on the bottom face of the insulating substrate and is electrically connected to the wiring pattern layer for connecting a light-emitting element through the conductive portion,
   wherein a light-emitting element is mounted on the wiring pattern layer for connecting a light-emitting element in the cavity for housing a light-emitting element;
   comprising the steps of:
   (A) forming a through hole for wiring, into which a conductive paste that is the conductive portion (d) is filled, in the green sheet in a plate shape that is a precursor of the nitride ceramics insulating substrate (a) in a plate shape in such a manner that the through hole is positioned below the nitride ceramics reflector frame (b), and preparing a green sheet for a substrate that is made of a green sheet in which a conductive paste layer that will be the wiring pattern layer for connecting a light-emitting element and a conductive paste layer that will be the wiring pattern layer for supply are formed on the upper and bottom faces, respectively,
   (B) preparing a green sheet for a reflector frame that is a precursor of the nitride ceramics reflector frame (b),
   (C) laminating the green sheet for a substrate and the green sheet for a reflector frame through a paste layer containing a nitride ceramics powder the same as a nitride ceramics powder contained in the green sheet for a substrate between the both green sheets, and
   (D) heating the laminate obtained in the step (C) to degrease and sinter the laminate.

2. A method as defined in claim 1, wherein the inside face of the reflector frame is inclined inside in such a manner that the inside face is a tapered face.

* * * * *

UNITED STATES PATENT AND TRADEMARK OFFICE
CERTIFICATE OF CORRECTION

| | |
|---|---|
| PATENT NO. | : 7,718,456 B2 |
| APPLICATION NO. | : 11/664181 |
| DATED | : May 18, 2010 |
| INVENTOR(S) | : Maeda et al. |

Figure 4:
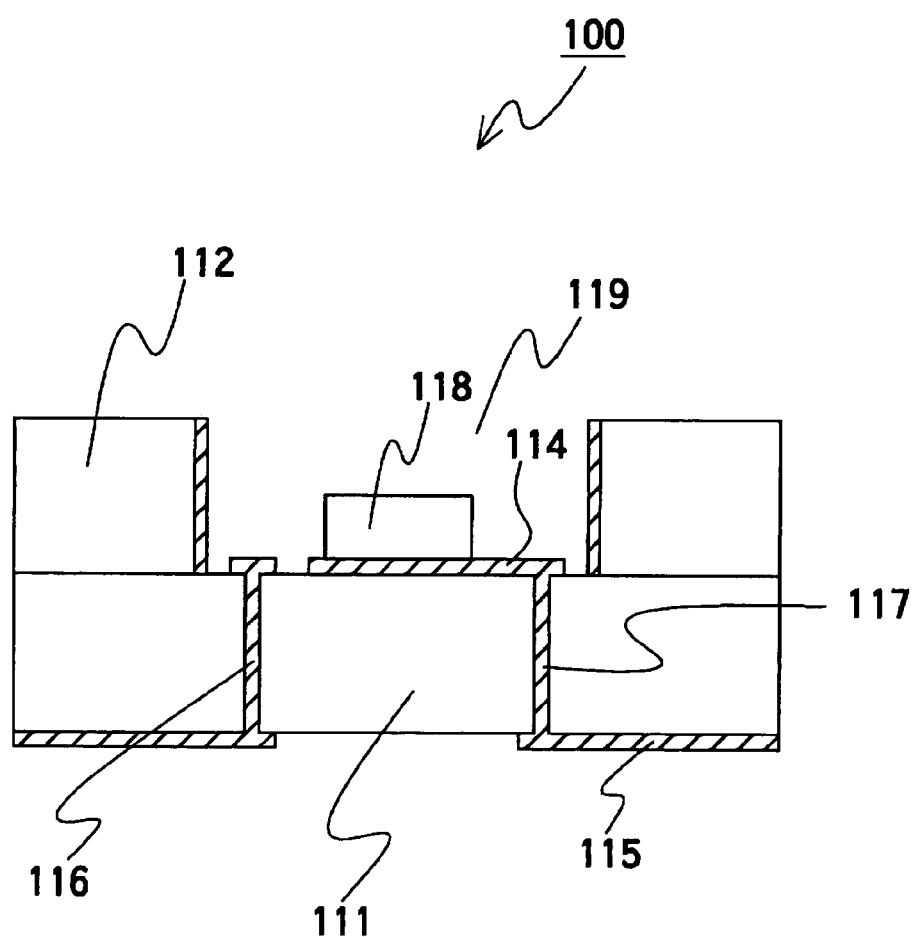
FIG. 4 is a cross-sectional view showing an embodiment of a conventional package for housing a light-emitting element.
Figure 5:
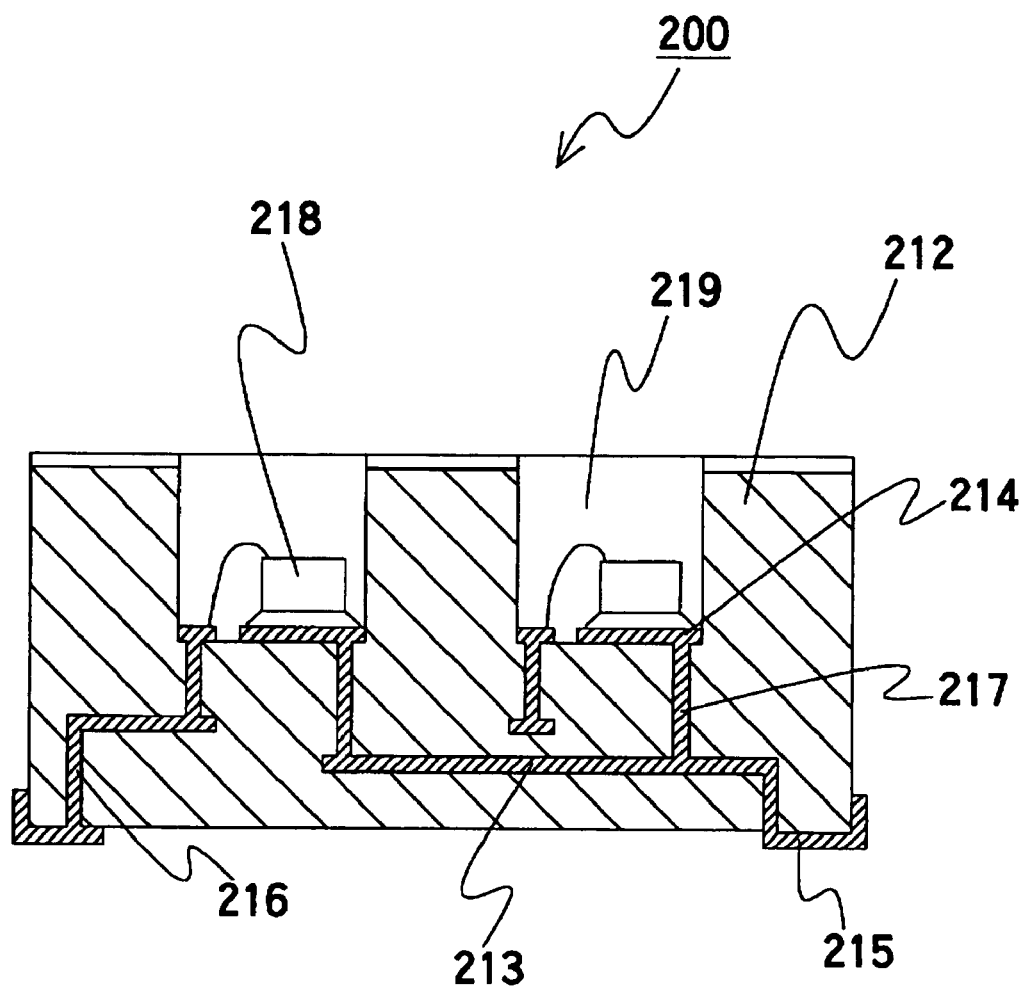
FIG. 5 is a cross-sectional view showing another embodiment of a conventional package for housing a light-emitting element.
Figure 6:
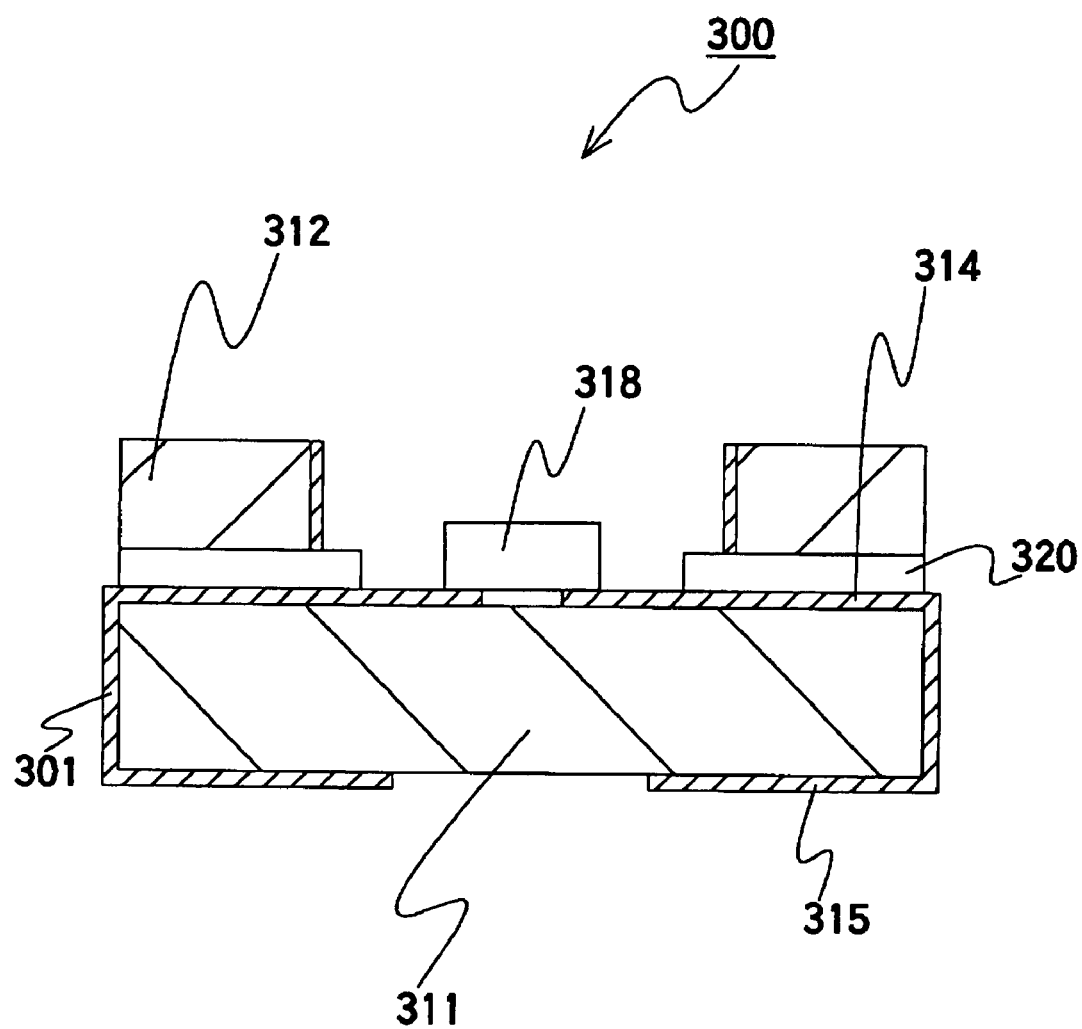
FIG. 6 is a cross-sectional view showing another embodiment of a conventional package for housing a light-emitting element.
Figure 4:
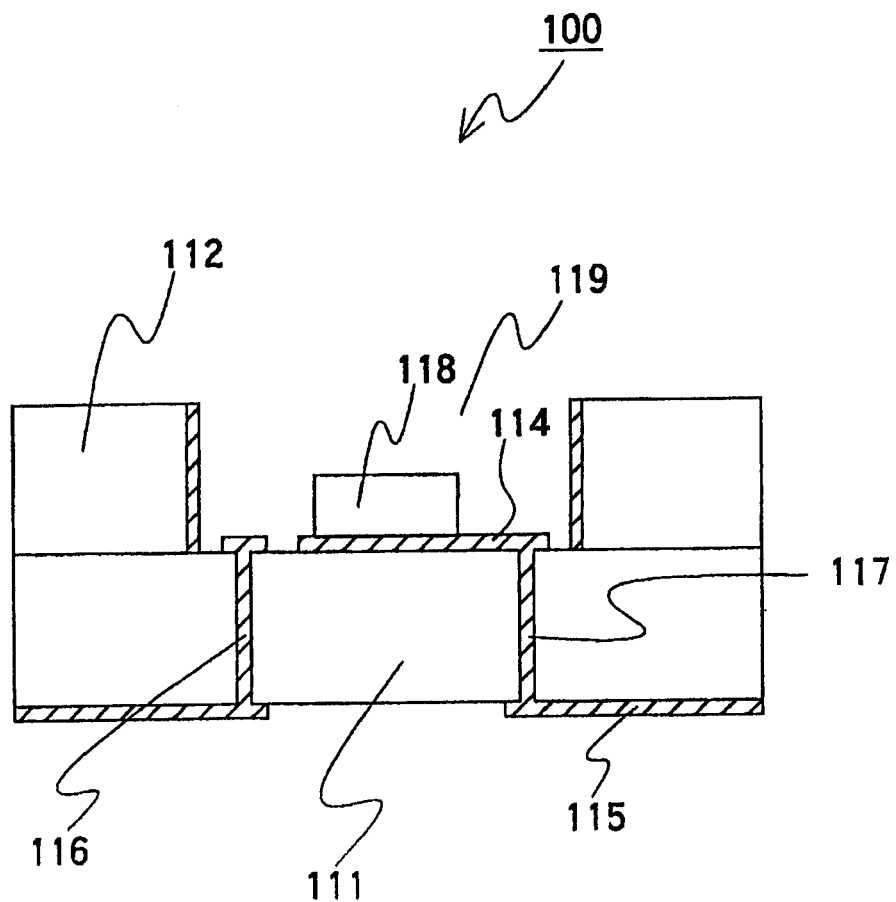
Figure 5:
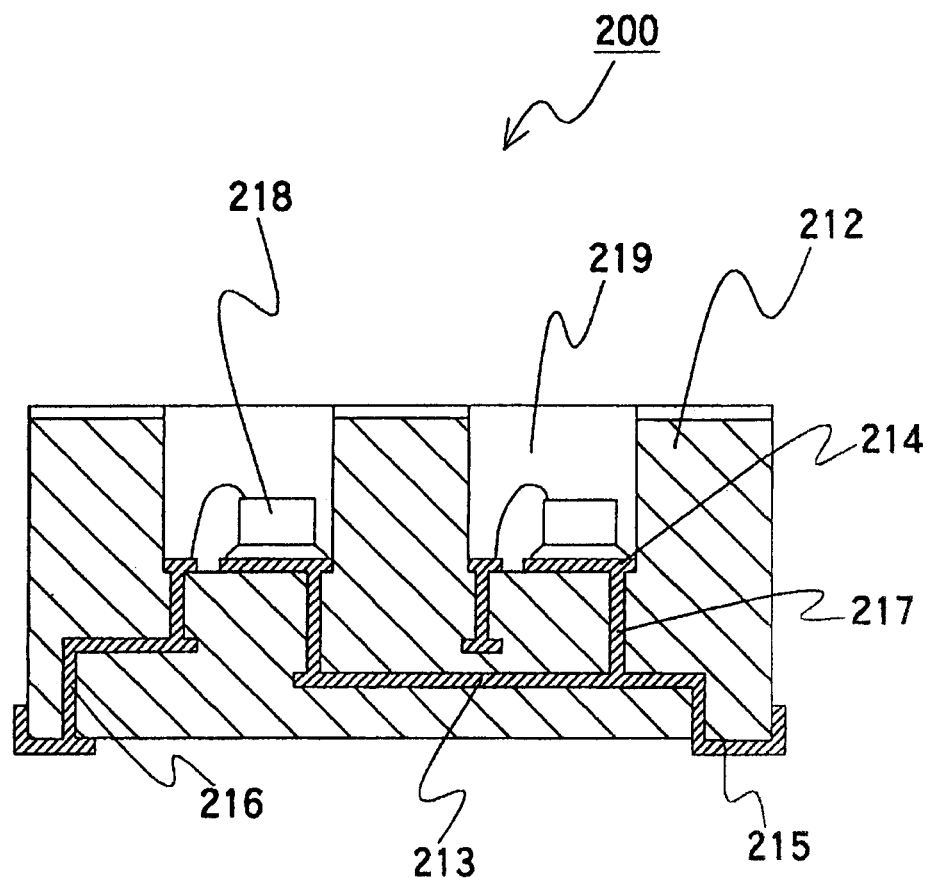
Figure 6:
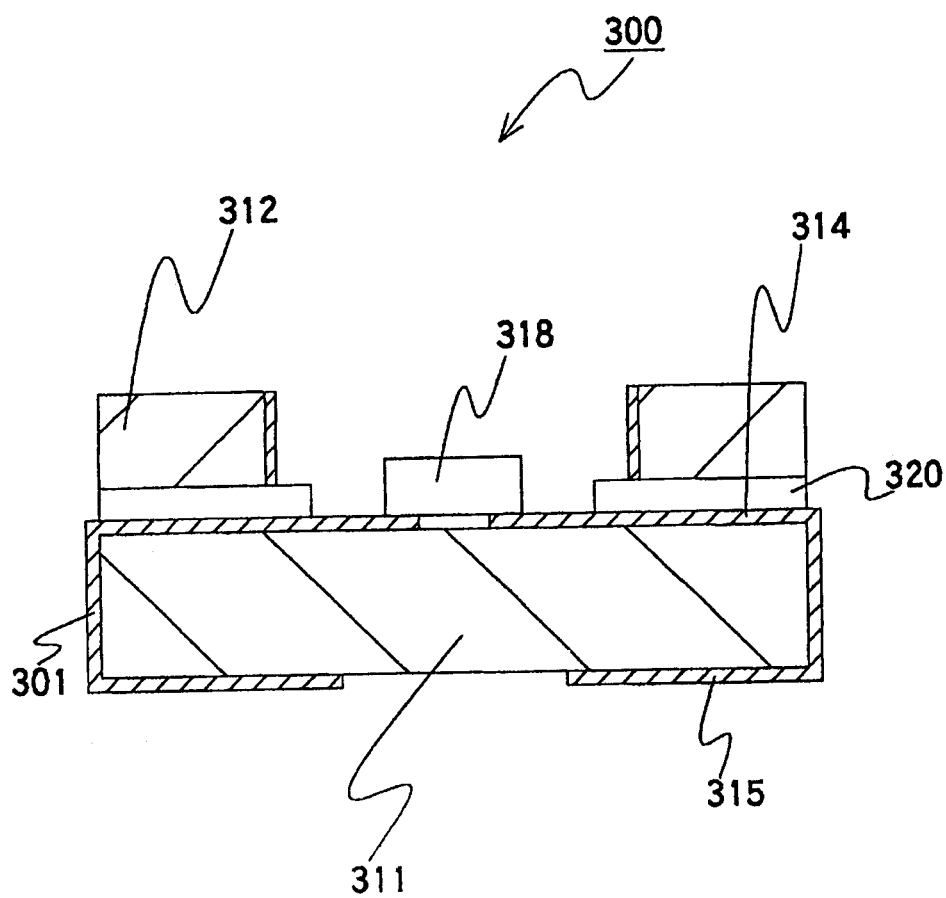

It is certified that error appears in the above-identified patent and that said Letters Patent is hereby corrected as shown below:

The drawings sheets, consisting of Figs. 4, 5, and 6, should be deleted to be replaced with the drawing sheets, consisting of Figs. 4, 5, and 6, as shown on the attached pages.

Signed and Sealed this

Sixteenth Day of November, 2010

David J. Kappos
*Director of the United States Patent and Trademark Office*